(12) United States Patent
Huang

(10) Patent No.: US 9,343,538 B2
(45) Date of Patent: May 17, 2016

(54) HIGH VOLTAGE DEVICE WITH ADDITIONAL ISOLATION REGION UNDER GATE AND MANUFACTURING METHOD THEREOF

(75) Inventor: Tsung-Yi Huang, Hsinchu (TW)

(73) Assignee: RICHTEK TECHNOLOGY CORPORATION, Chupei, Hsin-Chu (TW)

( * ) Notice: Subject to any disclaimer, the term of this patent is extended or adjusted under 35 U.S.C. 154(b) by 935 days.

(21) Appl. No.: 13/107,191

(22) Filed: May 13, 2011

(65) Prior Publication Data
US 2012/0286361 A1    Nov. 15, 2012

(51) Int. Cl.
*H01L 29/423* (2006.01)
*H01L 29/06* (2006.01)

(52) U.S. Cl.
CPC ...... *H01L 29/42368* (2013.01); *H01L 29/0653* (2013.01); *H01L 29/0696* (2013.01)

(58) Field of Classification Search
CPC ............. H01L 29/42368; H01L 29/0696; H01L 29/0653
USPC ................. 257/337, 339, E29.256, E21.417; 438/286
See application file for complete search history.

(56) References Cited

U.S. PATENT DOCUMENTS

| | | | | |
|---|---|---|---|---|
| 6,376,296 B2* | 4/2002 | Tung | ............................. | 438/221 |
| 6,392,274 B1* | 5/2002 | Tung | ............................. | 257/339 |
| 6,737,707 B2* | 5/2004 | Kikuchi | ............ | H01L 29/42368 257/347 |
| 7,122,876 B2* | 10/2006 | Wu | ........................ | H01L 21/74 257/374 |
| 7,129,559 B2* | 10/2006 | Wu et al. | ........................ | 257/510 |
| 7,368,785 B2* | 5/2008 | Chen et al. | ..................... | 257/341 |
| 7,384,836 B2* | 6/2008 | Wu et al. | ........................ | 438/197 |
| 7,629,631 B2* | 12/2009 | Yilmaz | ......................... | 257/260 |
| 8,293,612 B2* | 10/2012 | Lee | ................. | 438/296 |
| 8,299,548 B2* | 10/2012 | Komatsu et al. | .............. | 257/409 |
| 8,362,556 B2* | 1/2013 | Cha et al. | ........................ | 257/337 |
| 8,513,712 B2* | 8/2013 | Chu et al. | ....................... | 257/256 |
| 8,643,136 B2* | 2/2014 | Huang | ................ | H01L 29/0653 257/409 |
| 8,673,734 B2* | 3/2014 | Park | .............................. | 438/424 |
| 2003/0001202 A1* | 1/2003 | Kitamura | ...................... | 257/330 |
| 2004/0262685 A1* | 12/2004 | Zingg | ........................... | 257/347 |

(Continued)

FOREIGN PATENT DOCUMENTS

KR        2010063576 A    *   6/2010

OTHER PUBLICATIONS

Streetman, Ben G. et al.; Solid state electronic devices, fifth edition; Prentice Hall; New Jersey, 2000; pp. 427-428.*

(Continued)

*Primary Examiner* — John P Dulka
(74) *Attorney, Agent, or Firm* — Tung & Associates

(57) ABSTRACT

A high voltage device includes: a substrate having a first isolation structure to define a device region; a source and a drain in the device region; a gate on the substrate and between the source and the drain; and a second isolation structure. The second isolation structure includes a first isolation region and a second isolation region. The first isolation region is on the substrate and between the source and the drain, and is partially or totally covered by the gate. The second isolation region is in the substrate and below the gate, and has a depth in the substrate which is deeper than the depth of the first isolation region in the substrate, and the length of the second isolation region in a direction along an imaginary line connecting the source and the drain does not exceed one-third length of the first isolation region.

6 Claims, 3 Drawing Sheets

(56) References Cited

U.S. PATENT DOCUMENTS

| | | | |
|---|---|---|---|
| 2006/0286735 A1* | 12/2006 | Wu et al. | 438/197 |
| 2008/0197410 A1* | 8/2008 | Chiang et al. | 257/342 |
| 2009/0096022 A1* | 4/2009 | Chang | H01L 29/7817 257/343 |
| 2009/0174004 A1* | 7/2009 | Choi | 257/369 |
| 2010/0006937 A1* | 1/2010 | Lee | 257/343 |
| 2010/0032749 A1* | 2/2010 | Shrivastava | H01L 21/26586 257/328 |
| 2010/0102388 A1* | 4/2010 | Levin et al. | 257/343 |
| 2010/0270616 A1* | 10/2010 | Yanagi | H01L 21/823814 257/343 |
| 2012/0018840 A1* | 1/2012 | Kang | 257/508 |
| 2012/0217579 A1* | 8/2012 | Huang et al. | 257/335 |
| 2012/0223384 A1* | 9/2012 | Huang | H01L 29/0653 257/339 |
| 2014/0045313 A1* | 2/2014 | Huang et al. | 438/286 |
| 2014/0346598 A1* | 11/2014 | Han | H01L 29/7835 257/345 |

OTHER PUBLICATIONS

Wolf, S. et al.; Silicon Processing for the VLSI Era, vol. 1: Process Technology, second edition; Lattice Press; California, 2000; pp. 300-301.*

* cited by examiner

HIGH VOLTAGE DEVICE WITH ADDITIONAL ISOLATION REGION UNDER GATE AND MANUFACTURING METHOD THEREOF

BACKGROUND OF THE INVENTION

1. Field of Invention

The present invention relates to a high voltage device and a manufacturing method thereof, in particular to such device with reduced on-resistance and a method for manufacturing the device.

2. Description of Related Art

FIG. 1A shows a cross-section view of a prior art double diffused metal oxide semiconductor (DMOS) device which includes: a P-type silicon substrate 11; a first isolation structure 12 defining a device region 100, wherein the isolation structure 12 is formed by, for example, local oxidation of silicon (LOCOS); an N-type well 13 in the substrate 11; a source 14 and a drain 15 in the device region 100; a gate 16 between the source 14 and the drain 15; and a body region 17. FIG. 1B shows a cross-section view of a lateral double diffused metal oxide semiconductor (LDMOS) device which includes: a P-type silicon substrate 11; a first isolation structure 12 defining the device region 100, wherein the isolation structure 12 is formed by, for example, LOCOS; a source 14 and a drain 15 in the device region 100; a gate 16 between the source 14 and the drain 15; and a lateral diffusion drain 18 surrounding the drain 15 and separating the source 14 from the drain 15. Compared with low voltage devices, the prior art high voltage devices have a higher on-resistance (Ron); therefore, in applications requiring high-speed operation, the prior art high voltage devices are less effective.

In view of above, the present invention proposes a high voltage device with reduced Ron and a manufacturing method thereof to overcome the drawback in the prior art, so that the device is more effective in high-speed applications.

SUMMARY OF THE INVENTION

An objective of the present invention is to provide a high voltage device and its manufacturing method.

To achieve the foregoing objective, the present invention provides a high voltage device, comprising: a substrate having a first isolation structure to define a device region; a first conductive type source and a first conductive type drain in the device region; a gate on the substrate and between the source and the drain; and a second isolation structure including: a first isolation region on the substrate and between the source and the drain, wherein from top view, the first isolation region is partially or totally covered by the gate; and a second isolation region in the substrate and below the gate, wherein the second isolation region has a depth in the substrate which is deeper than the depth of the first isolation region in the substrate, and the length of the second isolation region in a direction along an imaginary line connecting the source and the drain does not exceed one-third length of the first isolation region.

The foregoing high voltage device may further include: a second conductive type well surrounding the drain, and a body region surrounding the source, such that the high voltage device forms a DMOS device.

The foregoing high voltage device may further include: a lateral diffusion drain separating the source and the drain, such that the high voltage device forms an LDMOS device.

In the foregoing high voltage device, the second isolation region may be a LOCOS or STI structure.

In another perspective of the present invention, it provides a method for manufacturing a high voltage device, comprising: providing a substrate; forming a first isolation structure in the substrate to define a device region, and forming a lower isolation region; forming an upper isolation region, wherein the upper isolation region has a depth in the substrate which is smaller than the depth of the lower isolation region in the substrate; forming a gate on the substrate, the gate partially or totally covering the upper isolation region; forming a first conductive type source and a first conductive type drain respectively at the both sides of the gate; wherein the length of the lower isolation region in a direction along an imaginary line connecting the source and the drain does not exceed one-third length of the upper isolation region.

In the foregoing method, the upper isolation region may be formed by depositing isolation material on the substrate, or the upper isolation region and the lower isolation region may be formed at least partially by a same process step.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
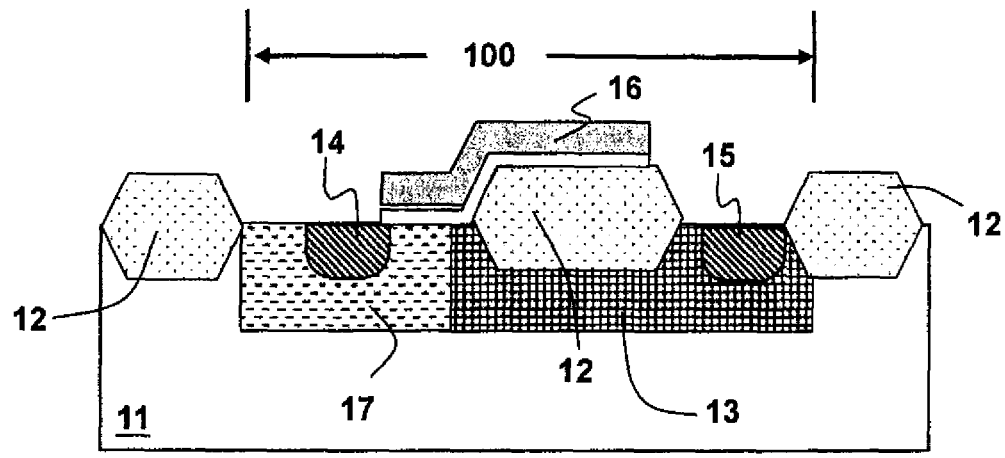
FIG. 1A shows, by cross-section view, a prior art DMOS device.
Figure 1B:
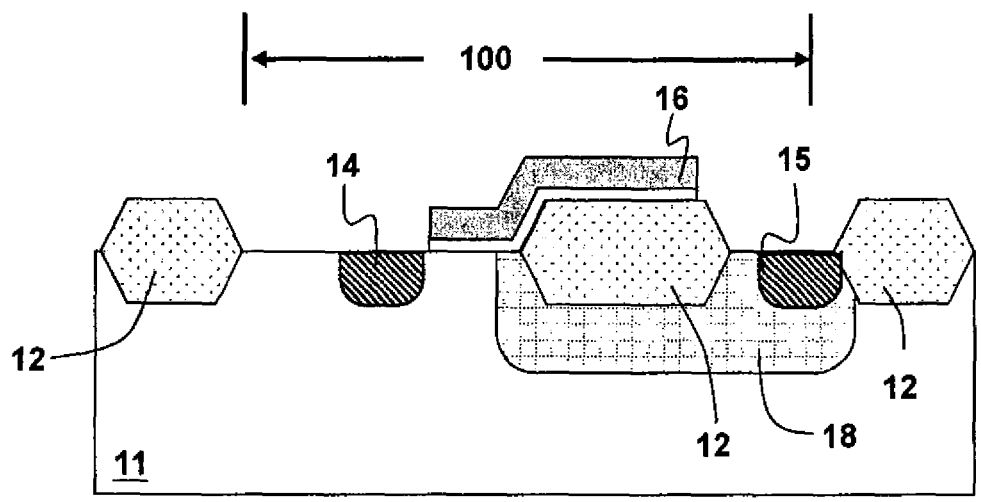
FIG. 1B shows, by cross-section view, a prior art LDMOS device.
Figure 2A:
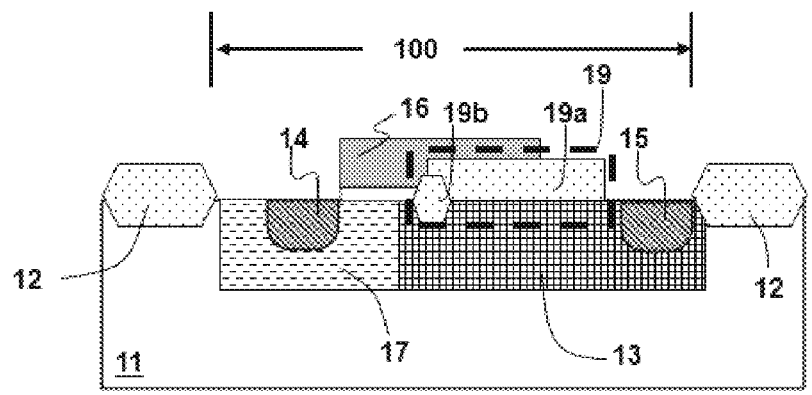
FIGS. 2A-2C show a first embodiment according to the present invention.
Figure 2B:
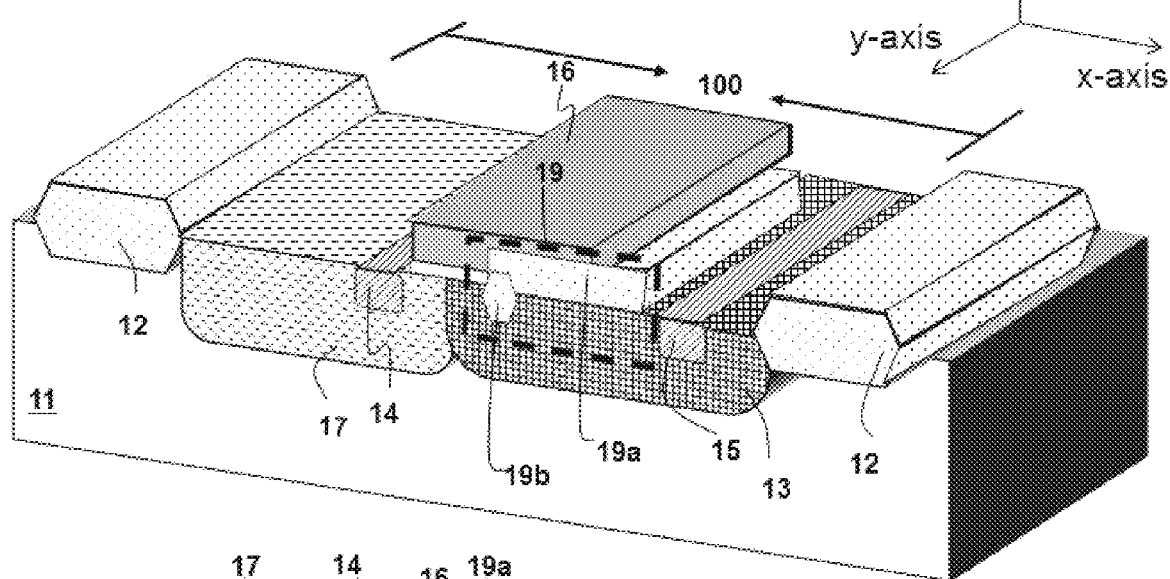
Figure 2C:
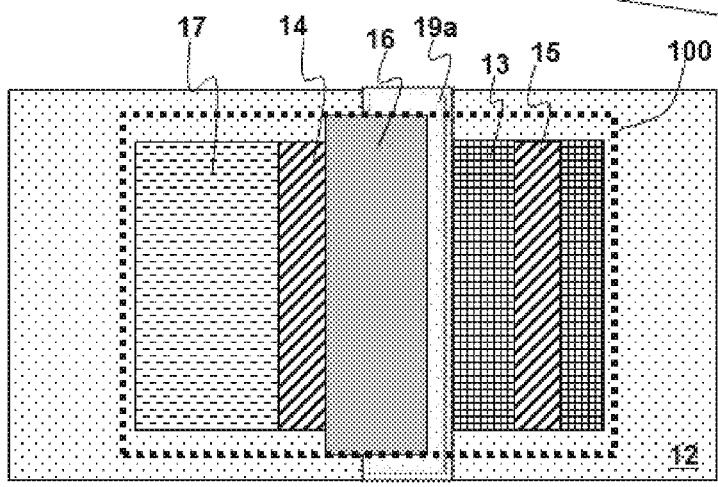

Please refer to FIGS. 2A-2C for a first embodiment of the present invention. FIGS. 2A, 2B, and 2C respectively show, by cross-section view, 3D view, and top view, a DMOS device of the first embodiment according to the present invention, wherein the device includes: a substrate 11 having a first isolation structure 12 to define a first device region 100; a first conductive type well 13, a source 14 and a drain 15 in the first device region 100 in the substrate 11; a gate 16 on the substrate 11, in the device region 100, and between the source 14 and the drain 15; a body region 17 surrounding the source 14; and a second isolation structure 19, including: a first isolation region 19a on the substrate 11, and between the source 14 and the drain 15, wherein from top view, the first isolation region 19a, for example, is partially or totally covered by the gate 16; and a second isolation region 19b in the substrate 11, below the gate 16, and for example, is located closer to a side of the first isolation region 19a closer to the source 14 than to a side of the first isolation region 19a closer to the drain 15, wherein from top view, the second isolation region 19b, for example, is partially or totally overlapped by the first isolation region 19a (in other embodiments, the second isolation region 19b may alternatively not be overlapped by the first isolation region 19a at all), and the length of the second isolation region 19b in x-axis direction (in a direction along an imaginary line connecting the source 14 and the drain 15) preferably does not exceed one-third length of the first isolation region 19a. It should be explained that the wording "the first isolation region 19a on the substrate 11" does not mean that the first isolation region 19a should be completely above the surface of the substrate 11, but means that the first isolation region 19a has a depth in the substrate 11 which is smaller than the depth of the second isolation region 19b in the substrate 11 (therefore, the first isolation region 19a is also referred to as the upper isolation region, and the second isolation region 19b is also referred to as the lower isolation region). Unlike the prior art, the present invention provides the second isolation structure 19 which is different to the conventional first isolation structure 12. In the present invention, at least a large part of the second isolation structure 19 is above the substrate 11, that is, only the second isolation region 19b is substantially in the substrate 11. The second isolation region 19b can suppress the hot carrier effect that degrades the device performance; that is, the second isolation region 19b can suppress the current leakage between the gate 16 and the substrate 11 so that the present invention provides substantially the same advantage as in the prior art, while because at least a large part of the second isolation structure 19 is above the substrate 11, the present invention also reduces Ron so that the device can operate in high-speed and provide a broader range of applications.

Please refer to FIGS. 2A-2C for the manufacturing process steps of the first embodiment according to the present invention. First, the substrate 11 is provided, in which is formed the first isolation structure 12 to define the device region 100, wherein the substrate 11 is, for example, a silicon on insulator (SOI) substrate or a silicon substrate, and the first isolation structure 12 is, for example, a LOCOS structure. Second, the second isolation region 19b can be formed by, for example, the same manufacturing process steps as the first isolation structure 12. Next, the first isolation region 19a can be formed by, for example, depositing isolation material on the substrate 11, or by the same manufacturing process steps as the second isolation region 19b. Next, the first conductive type well 13 is formed by doping first conductive type impurities which may be, for example but not limited to, N-type impurities. Next, the gate 16 is formed. Next, with a mask defined by lithography and the gate 16, an ion implantation process is performed to form a body region 17 with second conductive type impurities which may be, for example but not limited to, P-type impurities. Next, another mask is defined by lithography and the gate 16, and another ion implantation process is performed in the device region 100 to form the source 14 and the drain 15 with the first conductive type impurities which may be, for example but not limited to, the N-type impurities.

Figure 3:
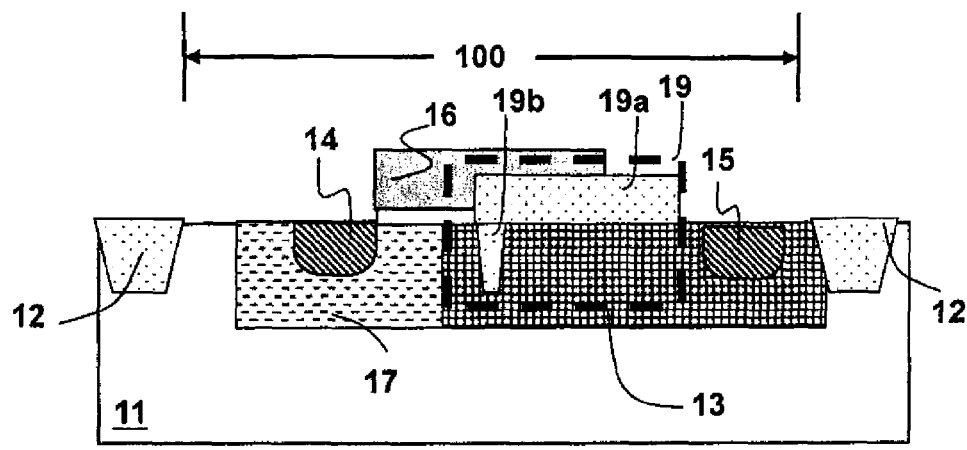
FIG. 3 shows a second embodiment according to the present invention.

FIG. 3 shows a DMOS device of a second embodiment according to the present invention. The structure and manufacturing process steps in this embodiment are similar to those in the first embodiment except the first isolation structure 12 and the second isolation region 19b. In this embodiment, the first isolation structure 12 is an STI structure and the second isolation region 19b is also an STI structure.

Figure 4:
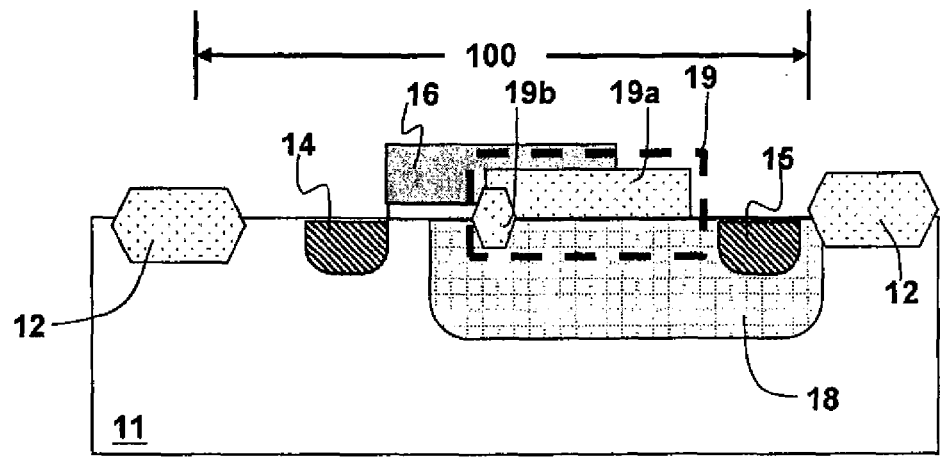
FIG. 4 shows a third embodiment according to the present invention.

FIG. 4 shows an LDMOS device of a third embodiment according to the present invention. Unlike the first embodiment, this embodiment does not have the first conductive type well 13 and the body region 17, but has a lateral diffusion drain 18 separating the source 14 and the drain 15, such that the device becomes the LDMOS device.

Figure 5:
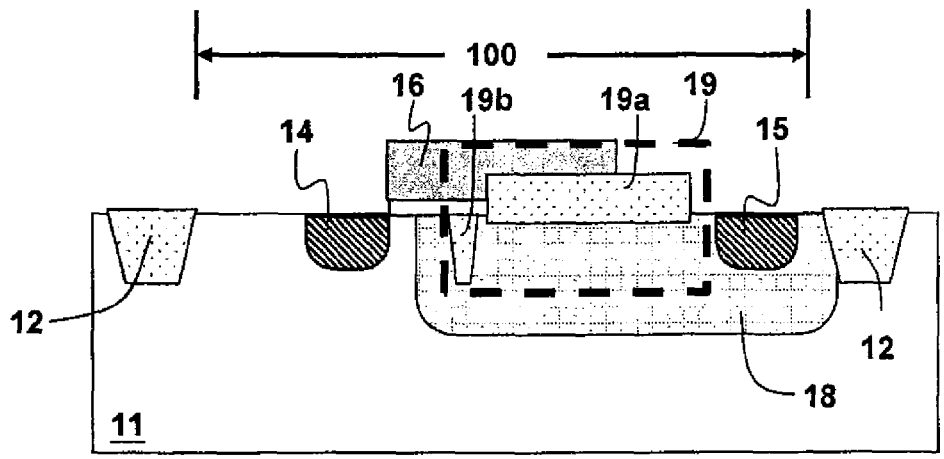
FIG. 5 shows a fourth embodiment according to the present invention.

FIG. 5 shows an LDMOS device of a fourth embodiment according to the present invention. This embodiment is similar to the third embodiment except modifications in the first isolation region 19a and the second isolation region 19b. In this embodiment, the second isolation region 19b is an STI structure, and the first isolation region 19a is not completely above the surface of the substrate 11 but has a little depth in the substrate 11. In addition, the first isolation region 19a does not overlap the second isolation region 19b at all, as shown in the figure.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other manufacturing process steps or structures which do not affect the characteristics of the devices, such as a deep-well region, etc., can be added. As another example, the lithography is not limited to photolithography; it can be electron beam lithography, X-ray lithography or other methods. Further, the number of the second isolation region 19b is not limited to one, but can be multiple. As another example, the second isolation region 19b is not limited to having a uniform thickness as shown in the embodiments, but can have an uneven thickness. Thus, the present invention should cover all such and other modifications and variations, which should be interpreted to fall within the scope of the following claims and their equivalents.

What is claimed is:

1. A method for manufacturing high voltage device, comprising:
   providing a substrate having an upper surface;
   forming a first isolation structure in the substrate to define a device region, and forming a lower isolation region, wherein the first isolation structure and the lower isolation region are formed by the same process steps, wherein by forming the first isolation structure and the lower isolation region in the substrate, the upper surface of the substrate has recessed portions interfacing the first isolation structure and the lower isolation region, and a flat portion which does not interface the first isolation structure and the lower isolation region;
   forming an upper isolation region by depositing an isolation material on the flat portion of the upper surface of the substrate, such that the upper isolation region consists of the isolation material on the flat portion of the upper surface of the substrate;
   forming a gate on the substrate, the gate partially or totally covering the upper isolation region; and
   forming a first conductive type source and a first conductive type drain respectively at both sides of the gate;
   wherein the length of the lower isolation region in a direction along an imaginary line connecting the source and the drain does not exceed one-third length of the upper isolation region.

2. The method of claim 1, further comprising: forming a first conductive type well surrounding the drain and a body region surrounding the source, to form a DMOS device.

3. The method of claim 1, further comprising: forming a lateral diffusion drain separating the source and the drain, to form an LDMOS device.

4. The method of claim 1, wherein lower isolation region is a LOCOS structure or an STI structure.

5. The method of claim 1, wherein the lower isolation region is below the upper isolation region and is closer to a side of the upper isolation region closer to the source than to a side of the upper isolation region closer to the drain, and wherein from top view, the lower isolation region is partially or totally overlapped by the upper isolation region.

6. The method of claim 1, wherein the upper isolation region and the lower isolation region are formed at least partially by a same process step.

* * * * *